(12) United States Patent
Chen et al.

(10) Patent No.: US 12,219,740 B2
(45) Date of Patent: Feb. 4, 2025

(54) REVERSE-RETURN PARALLEL LOOP THERMAL MANAGEMENT SYSTEM FOR AN ELECTRONIC DEVICE

(71) Applicant: Advanced Liquid Cooling Technologies Inc., Anderson, SC (US)

(72) Inventors: Nan Chen, Alpharetta, GA (US); He Zhao, Flagstaff Hill (AU); Yunshui Chen, Greer, SC (US)

(73) Assignee: Advanced Liquid Cooling Technologies Inc., Anderson, SC (US)

( * ) Notice: Subject to any disclaimer, the term of this patent is extended or adjusted under 35 U.S.C. 154(b) by 239 days.

(21) Appl. No.: 17/360,003

(22) Filed: Jun. 28, 2021

(65) Prior Publication Data
US 2022/0418166 A1  Dec. 29, 2022

(51) Int. Cl.
*H05K 7/20* (2006.01)

(52) U.S. Cl.
CPC ..... *H05K 7/20772* (2013.01); *H05K 7/20263* (2013.01); *H05K 7/20272* (2013.01); *H05K 7/20327* (2013.01); *H05K 7/2039* (2013.01)

(58) Field of Classification Search
CPC .......... H05K 7/20772; H05K 7/20263; H05K 7/208; H05K 7/20272
See application file for complete search history.

(56) References Cited

U.S. PATENT DOCUMENTS

| | | | |
|---|---|---|---|
| 2002/0117291 A1* | 8/2002 | Cheon | G06F 1/20 165/80.4 |
| 2013/0077246 A1* | 3/2013 | Campbell | B23P 15/26 361/700 |

* cited by examiner

*Primary Examiner* — Lionel Nouketcha
(74) *Attorney, Agent, or Firm* — Nutter McClennen & Fish LLP

(57) ABSTRACT

A reverse-return parallel loop system is provided, including a cooling cycle comprised of a plurality of heat sinks, at least one heat exchanger, and at least one liquid pump to carry liquid coolant through the system. Each heat sink has a vapor inlet, a liquid inlet, a vapor outlet, and a liquid outlet. The liquid coolant is pumped into the heat sink through the liquid inlet where the coolant splits in to two streams, where one stream flows out of the liquid outlet towards the next heat sink downstream, and the other stream flows through the heat sink, and through the heat exchanger core to absorb heat from the heat sources and become at least partially vaporized by the heat. This stream then merges with vapor from other heat sinks upstream and flows out through the vapor outlet back towards the heat exchanger of the system.

20 Claims, 9 Drawing Sheets

REVERSE-RETURN PARALLEL LOOP THERMAL MANAGEMENT SYSTEM FOR AN ELECTRONIC DEVICE

CROSS-REFERENCE TO RELATED APPLICATIONS

Not applicable.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to an efficient electronic device cooling system, including a cooling system for servers. More particularly, certain embodiments of the invention relate to a reverse-return parallel loop system.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

High data center energy demands may result in significantly increased energy densities in many data center facilities. As such, efficient cooling for data centers has become an increasingly important and challenging task. Typical data centers may require a temperature range between 18° C. and 27° C. for air-cooled systems, with processor temperatures of up to approximately 85° C. However, greater cooling may result in decreased energy cost and greater processor performance, and may be achieved by, for example, without limitation, improving heat transfer between the processors and the cooling unit. Additionally, heat waste from the processors may be utilized and recycled as a resource instead of being passively discarded into the environment. Depending on the temperature available, the heat may be used for, for example, without limitation, local space, or hot-water heating at low temperatures (30-40° C.), reheating for district heating supply at medium temperatures (50-60° C.), cold resources of heat pump supplying higher temperatures (70-90° C.), etc.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. By way of educational background, another aspect of the prior art generally useful to be aware of is that modern cooling configurations typically comprise two major loop modes: a serial loop and a parallel loop.

FIG. 1 illustrates an exemplary serial loop system. Within serial loop system 100, a coolant supply may flow through each terminal unit before returning to a pump. Each of heat sinks 102-108 may include heat exchanging cores 110-116 and flow regulation valves 118-124. Working fluid from pump 130 may be pumped through thorough liquid supply hose 128 to first inlet port 126 for cooling of a first central processing unit (CPU) via first heat sink 102, and flow out of first heat sink 102 through first outlet port 146. First outlet port 146 of first heat sink 102 may be connected to second inlet port 148 of second heat sink 104 via first tube 158. Similarly, second outlet port 150 may be connected with third inlet port 152 via second tube 160, and third outlet port 154 may be connected with fourth inlet port 156 via third tube 162. Fluid from fourth heat sink 116 may then return to vapor manifold 140 via vapor return hose 142. The working fluid may then be condensed by coolant circulated between coolant inlet 136 and coolant outlet 138 in heat exchanging core 144 of microchannel heat exchanger 134. Any resultant condensation may be collected in liquid reservoir 132 and suctioned by pump 130. While simple to utilize, serial loop system 100 may not be ideal in that the number of heat sinks may be limited as the coolant temperature may continually rise with each subsequent heat sink, resulting in diminishing cooling capabilities in downstream heatsinks. With enough heat sinks in series, downstream heatsinks may not receive adequate cooling to maintain a desirable temperature. Additionally, without any control mechanism for each cold header, a load variation of one heat source may impact the temperature of each other heat source, which may cause undesirable temperature fluctuation.

FIG. 2 illustrates an exemplary parallel loop system. Each of heat sinks 202-208 may include microchannel heat exchanging cores 210-216. Working fluid from pump 220 may be pumped into a supply manifold 250, which may evenly distribute fluid to heat sinks 210-216 via supply tubes 254-260. Each of supply tubes 254-260 may be connected to first inlet port 218, second inlet port 238, third inlet port 242, and fourth inlet port 246, respectively. Additionally, first outlet port 236, second outlet port 240, third outlet port 244, and fourth outlet port 248 may be connected via return tubes 266-272 to return manifold 252. The fluid in return manifold 252 may flow back to vapor manifold 230 through vapor return hose 232. The working fluid may be condensed by coolant circulated between coolant inlet 226 and coolant outlet 228 in heat exchanging core 234 of heat exchanger 224. Condensed working fluid may be collected in liquid reservoir 222 and suctioned by pump 220. In contrast with a serial loop system, parallel loop system 200 may achieve more equal inlet and outlet conditions for each of heat sinks 202-208, at the expense of requiring larger manifolds and multiple supply and return lines through a server chassis. Additionally, the thermal boundaries of each branch within parallel loop system 200 may be different due to load variation between each CPU.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 4A-4C illustrate an exemplary reverse-return parallel loop system for four processing units, wherein FIG. 4A shows a block diagram of a reverse-return parallel loop system, FIG. 4B shows a front view of a reverse-return parallel loop system, and FIG. 4C shows a perspective view of a reverse-return parallel loop system, in accordance with an embodiment of the present invention;

FIGS. 5A-5B illustrate exemplary flow paths within a reverse-return parallel loop system, wherein FIG. 5A shows a flow path for a first CPU and FIG. 5B shows a flow path of a second CPU, in accordance with an embodiment of the present invention;

Figure 1:
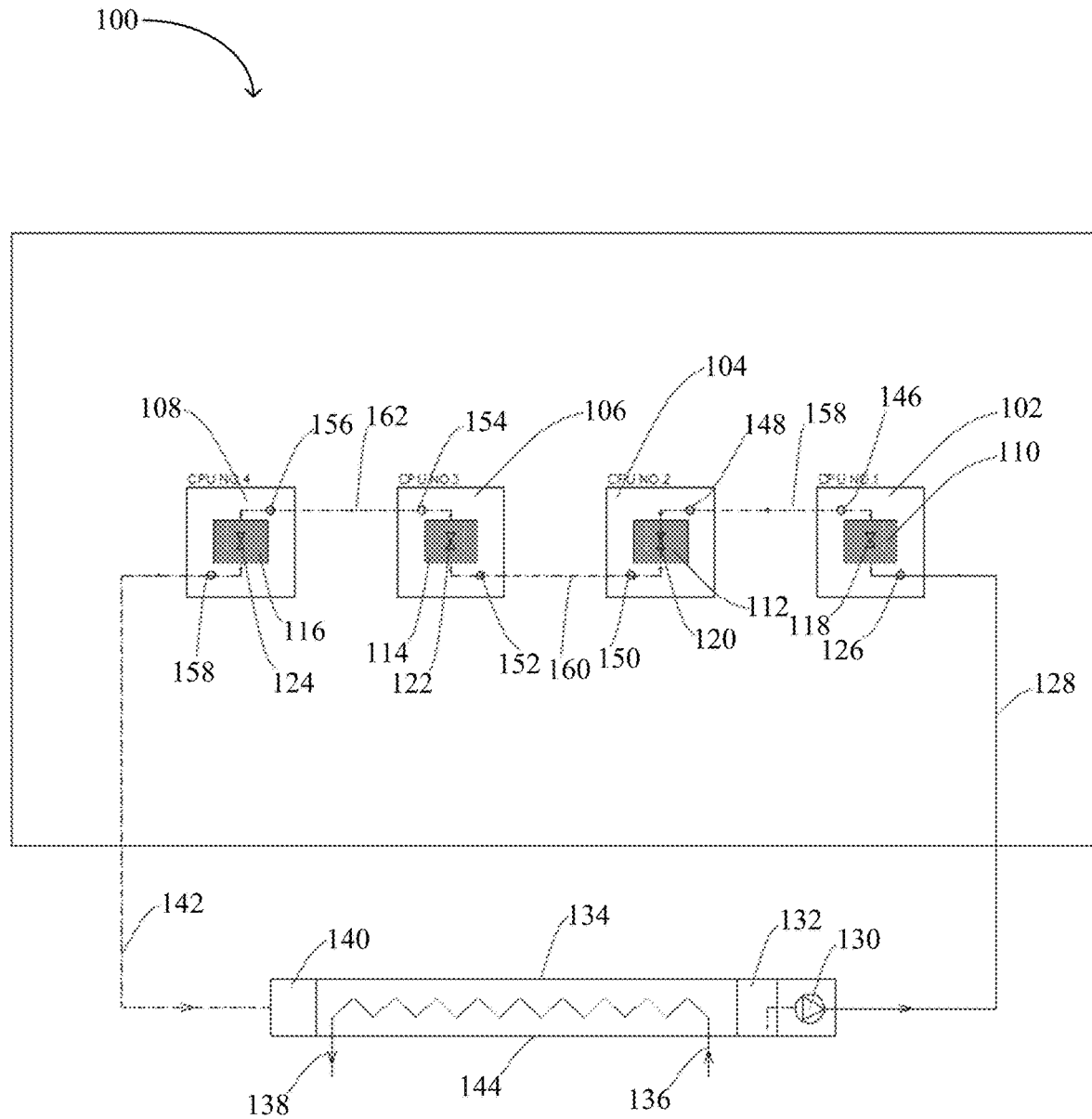
FIG. 1 illustrates an exemplary serial loop system.
Figure 2:
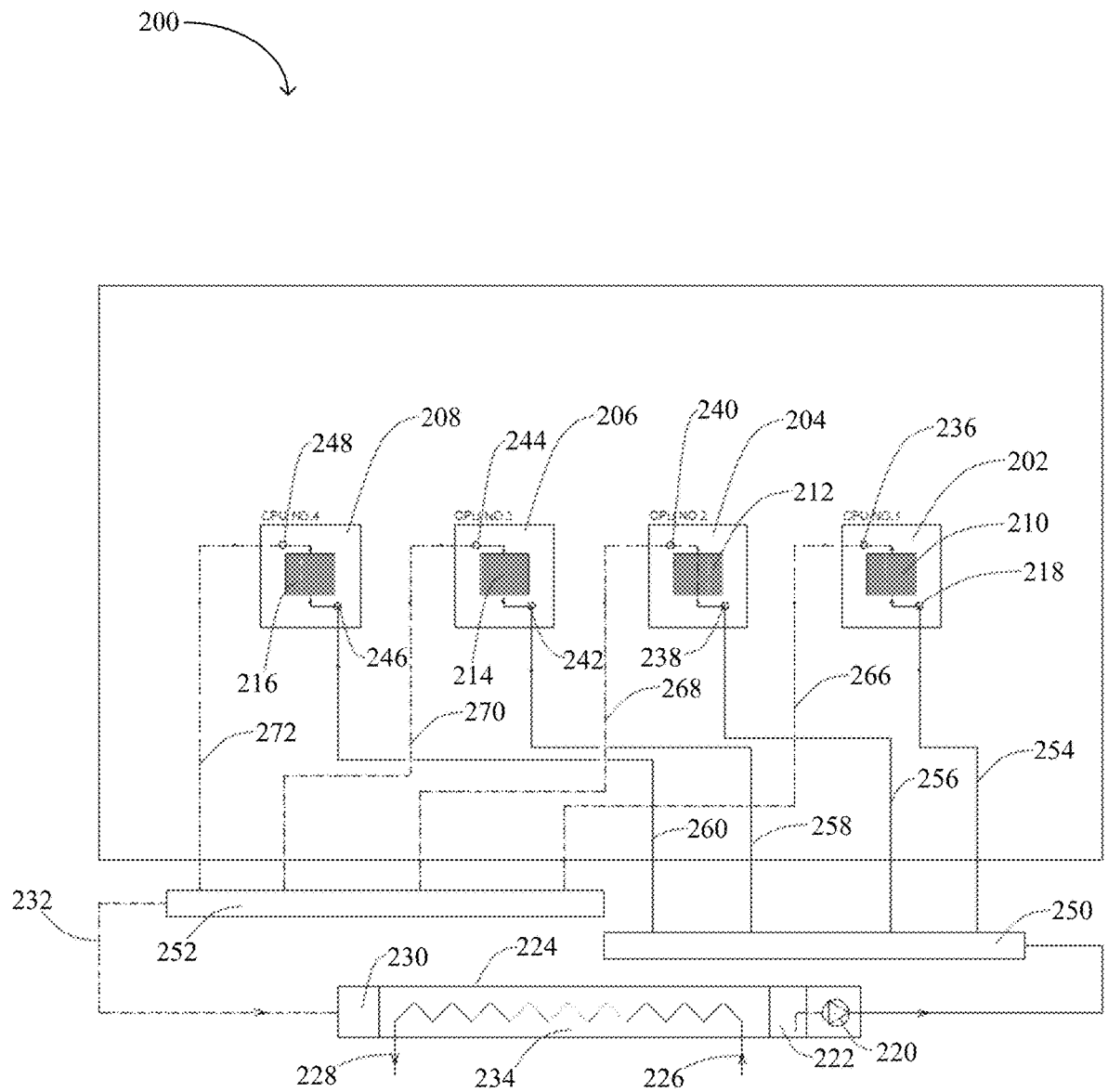
FIG. 2 illustrates an exemplary parallel loop system.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearward most point of the upper or outsole.

Similarly, the term 'substantially' is well recognize in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of Claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, is generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/ services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of them— Such terms are open-ended and mean "including but not limited to". When employed in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

The term "thermal communication" refers to the transfer of heat from one element to another abutting element, which may also be referred to as "thermal transmission".

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s).

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Figure 3:
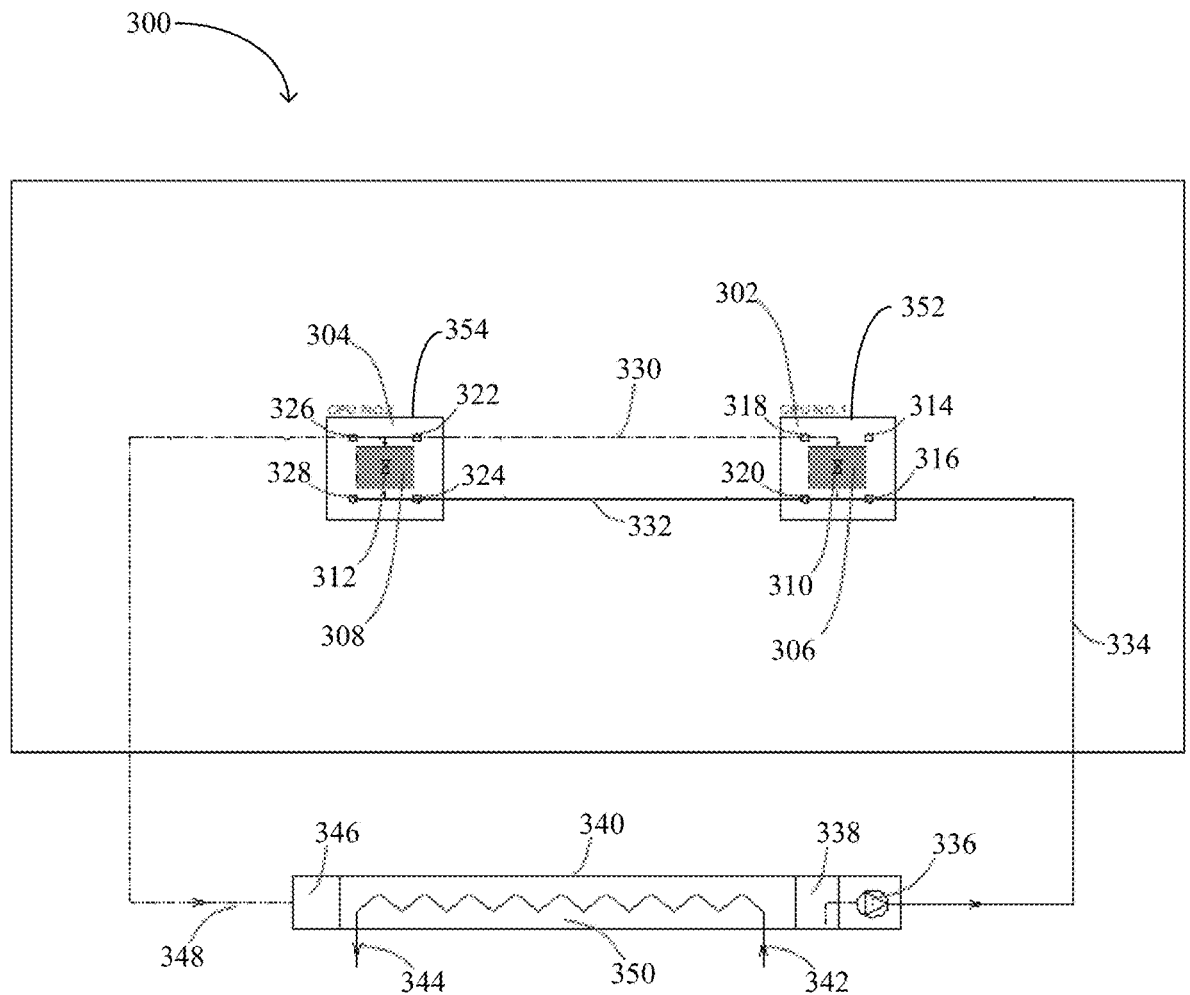
FIG. 3 illustrates an exemplary reverse-return parallel loop system with two processing units, in accordance with an embodiment of the present invention.

FIG. 3 illustrates an exemplary reverse-return parallel loop system with two processing units, in accordance with an embodiment of the present invention. Reverse-return parallel loop system 300, also known herein as a cooling cycle, may include two processing units to be cooled by first heat sink 302 and second heat sink 304. First heat sink 302 may include first liquid inlet port 316, first vapor inlet port 314, first liquid outlet port 320, and first vapor outlet port 318. Supply liquid from first liquid inlet port 316 may be divided into two streams, or thermal paths. A first stream, or path, may flow to first liquid outlet port 320, and a second stream, or path, may flow through first microchannel heat exchanging core 306. The second stream may be partially vaporized, and resultant vapor may flow through vapor outlet port 318. The vapor that may flow through first vapor outlet port 318 may include vapor from first microchannel heat exchanging core 306 and vapor from first vapor inlet port 314. As first heat sink 302 may be installed on the first CPU along the flow direction of the coolant, first vapor inlet port 314 may be blinded. The term blinded indicates that the port on the heat sink is blocked. The function of first vapor inlet port 314 and second vapor inlet port 322, as shown in FIG. 3, is to collect the mixture of vapor and unvaporized liquid from the heat sinks 302 and 304, respectively, at their upstream. Because there is no vapor liquid to be collected at the first heat sink 302, vapor inlet port 314 is blocked. Additionally, first liquid outlet port 320 of first heat sink 302 may be connected to second liquid inlet port 324 of second heat sink 304 via liquid connection line 332. Similarly, first vapor outlet port 318 of first heat sink 302 may be connected to second vapor inlet port 322 of second heat sink 304 via vapor connection line 330. It should be appreciated that both vapor connection line 330 and liquid connection line 332 are both conduits.

Second heat sink 304 may include second liquid inlet port 324, second liquid outlet port 328, second vapor inlet port 322, and second vapor outlet port 326. Supply liquid from second liquid inlet port 324 may flow through second microchannel heat exchanging core 312. The liquid stream through second microchannel heat exchanging core 308 may be partially vaporized, and resultant vapor may flow to second vapor outlet port 326. The vapor that may flow through second vapor outlet port 326 may include vapor from second microchannel heat exchanging core 308 and vapor from vapor inlet port 322. As second heat sink 304 may be installed on the last CPU along the flow direction of the coolant, second liquid outlet port 328 may be blinded. Heat sink 304 is the last heat sink along the direction of liquid flow. Liquid outlet port 328 may be blocked because there is no downstream heat sink for the liquid to flow. Second vapor outlet port 326 of second heat sink 304 may be connected to vapor return hose 348. As the length and size of the flow path through each of first heat sink 302 and second heat sink 304 are substantially equal, the flow paths may be inherently hydraulically balanced, which may result in improved cooling performance.

First flow regulation valve 310 and second flow regulation valve 312 of first heat sink 302 and second heat sink 304, respectively, may be driven by one or more thermal or electrical actuators and utilized for flow control to further control CPU temperatures through thermal transmission; the transfer of heat from the CPU to the heat sink and thereby, to the liquid coolant. First flow regulation valve 310 and second flow regulation valve 312 may be, for example, without limitation, mechanical valves including a thermal actuator and regulation valve mechanism. The thermal actuator may be, for example, without limitation, a wax thermal actuator, a bulb thermal actuator, a diaphragm thermal actuator, a bimetal thermal actuator, a hybrid version of the aforementioned thermal actuators, etc. The regulation valve mechanism may be driven by the thermal actuator to maintain a constant CPU temperature. Because the flow paths through first heat sink 302 and second heat sink 304 are effectively the same length, the required effective pressure drop on each of first flow regulation valve 310 and second flow regulation valve 312 may be small, which may result in low energy loss. Similarly, the head pressure of liquid pump 336 may also be low.

Moreover, the mechanical vales include a thermal actuator and regulation valve mechanics, as stated above. The actuator can generate mechanical displacement after sensing the temperature variations of heat sources. The regulation valve mechanism will be driven by the thermal actuator to regulate the flow by increasing or decreasing the opening of the valve. The thermal actuator can be based on the principles of thermal-volume expansion, such as a wax thermal actuator (the volume of wax may change with the temperature variation), as noted above. The thermal actuator may also be a bulb-type, diaphragm-type, or bimetal-type thermal actuator (the volume of charging fluid could change with the temperature variation). The thermal actuator could also be a servomotor-type (i.e. step motor) in addition to temperature sensors (i.e., PTC). Temperature sensors will generate the electrical signals with the temperature variation, which will be used to control/drive the movement of the servomotor. The regulation valve mechanism driven by the thermal actuator is similar to the traditional flow regulation valve, which normally includes a valve needle and valve body. The flow volume could be regulated by varying the opening between valve needle and valve body.

First microchannel heat sink 302 and second microchannel heat sink 304 may be mounted on first CPU 352 and second CPU 354, respectively. The thermal actuators of first flow regulation valve 310 and second flow regulation valve 312 may be tightly coupled with the top surface of first CPU 352 and second CPU 354 to facilitate quick and accurate responses to variations in temperature. First microchannel heat exchanging core 306 and second microchannel heat exchanging core 308 may be located inside first microchannel heat sink 302 and second microchannel heat sink 304, respectively. First microchannel heat exchanging core 306 and second microchannel heat exchanging core 308 may be composed of bunches of multilayered, radial microchannels. The quality of the inlet fluid may be controlled at the fluid's subcooled status, which may ensure a best heat transferring coefficient at the lowest wall temperature with a minimal pressure drop.

Microchannel heat exchanger 340, also known herein as a system heat exchanger, may be connected to first heat sink 302 and second heat sink 304 via liquid supply hose 334 and vapor return hose 348. It may be appreciated that liquid supply hose 334 and vapor return hose 348 are both considered conduits. Liquid supply hose 334 and vapor return hose 348 may be composed of rigid materials, such as, without limitation, copper, plastic, etc. or flexible materials, such as, without limitation, rubber, plastic, fiberglass, etc. The type of tube used may depend on various factors, such as, without limitation, pressure rating of the refrigerant, cost of available materials, etc. For example, if a high pressure refrigerant was used, the flexible hose could be a polyamide tube, polyester braid, PU sheath. If the working fluid was water, the tube could be PVC. Hard tunes, like copper, may also be used, though it involved higher installation costs and maintainability concerns. Thus, minimal changes to a server chassis are required to incorporate reverse-return parallel loop system 300. Further, large supply and return manifolds may not be required in the present embodiment.

Microchannel heat exchanger 340 may include vapor manifold 346, heat exchanging core 350, liquid reservoir 338, and one or more liquid pumps 336. Return vapor from second heat sink 304 may be supplied through vapor return hose 348 and distributed into the channels of heat exchanging core 350 via vapor manifold 346. Vapor may be condensed into liquid using cold liquid, in thermal communication, supplied through coolant inlet 342 and returned through coolant outlet 344. Vapor that is condensed into liquid may flow into liquid reservoir 338. Subsequently, one or more liquid pumps 336 in the liquid pump station may transfer liquid from liquid reservoir 338 into liquid supply hose 334.

In the present embodiment, single-phase fluids or two-phase fluids may be used in reverse-return parallel loop system 300. Single-phase fluids may include, for example, without limitation, water, glycol solutions, dielectric fluids, etc. Single-phase fluids may provide better flow stability as the length of the flow paths of first heat sink 302 and second heat sink 304 are substantially the same and the fluid status within the flow paths may remain the same. As such, first heat sink 302 and second heat sink 304 may operate in hydraulic equilibrium. First flow regulation valve 310 and second flow regulation valve 312 may not need to compensate for hydraulic imbalance between each of the heat sinks, which may simplify the valve design and provide for higher control sensitivity. Two-phase fluids may include, for example, without limitation, various types of refrigerants, etc. and result in a different fluid state in connection lines between first heat sink 302 and second heat sink 304, which may lead to hydraulic nonequilibrium between the heat sinks. The main advantages of two-phase fluid against a single phase fluid are the higher heat exchanging efficiency and the higher heat exchanging capacity per flow volume. Two-phase heat exchanging is usually enhanced by the presence of bubbling, which can break the boundary layer and carry heat away promptly. Because of the phase changing, the latent heat per volume may be significantly larger than the sensible heat, which needs comparatively less flow to cool a certain kilowatt heat source. As a result, the energy used to drive fluid (i.e., pump energy consumption) in a two-phase cooling system will be much less than that in a single-phase system. Although, the flow stability may be a barrier for the two-phase flow to replace the single-phase cooling completely. The advantages of its high efficiency cannot be overlooked.

Figure 4A:
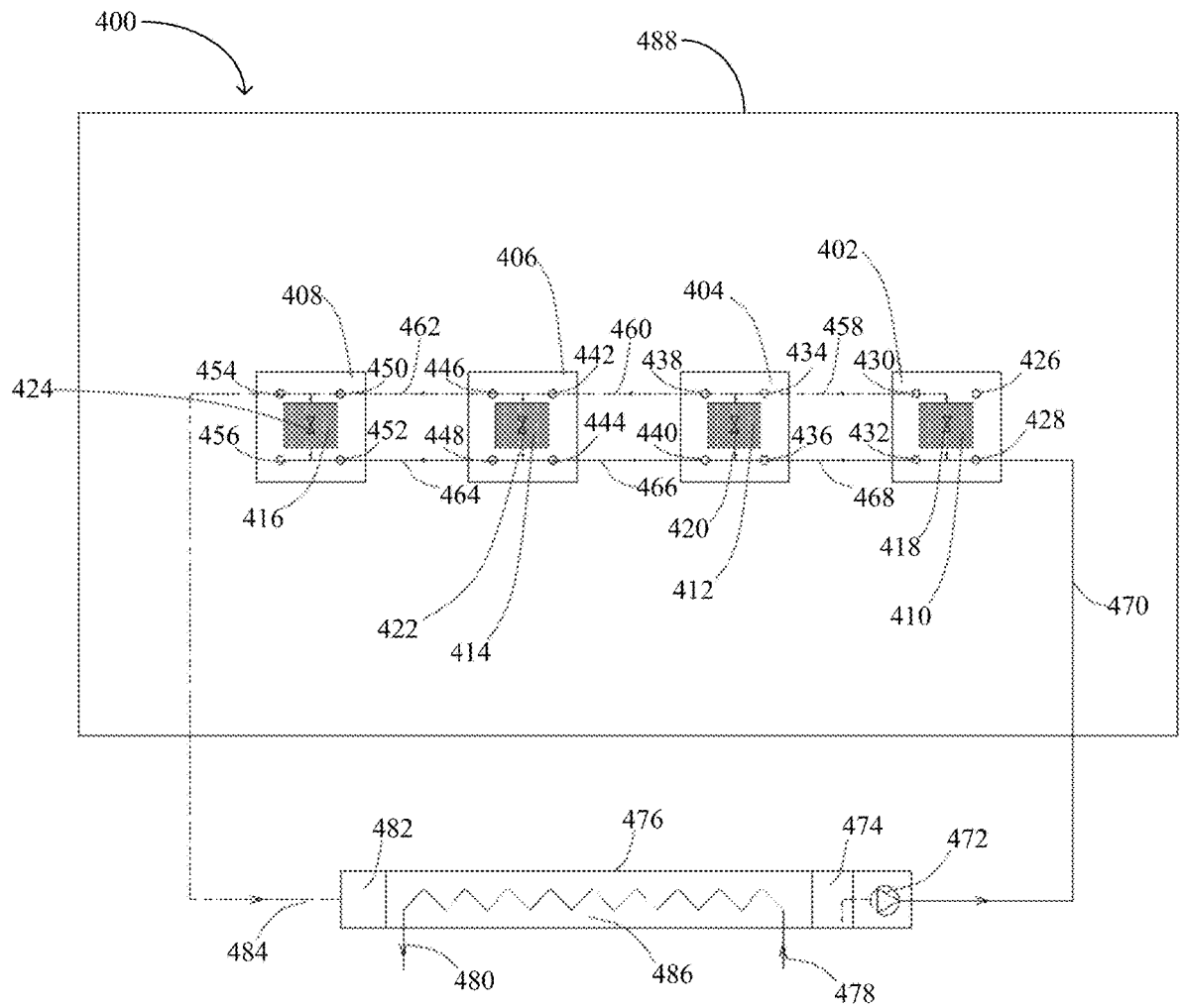
Figure 4B:
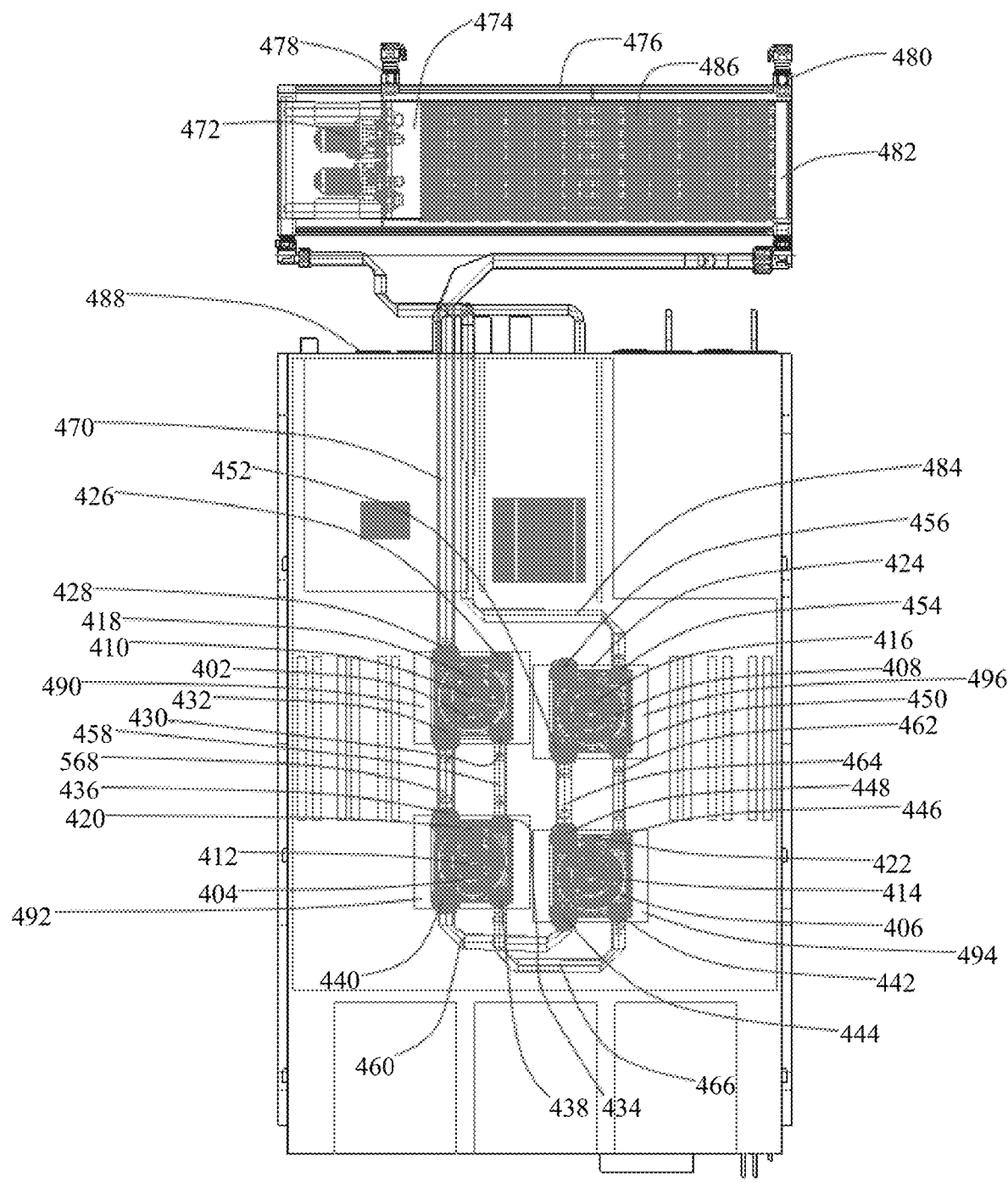
Figure 4C:
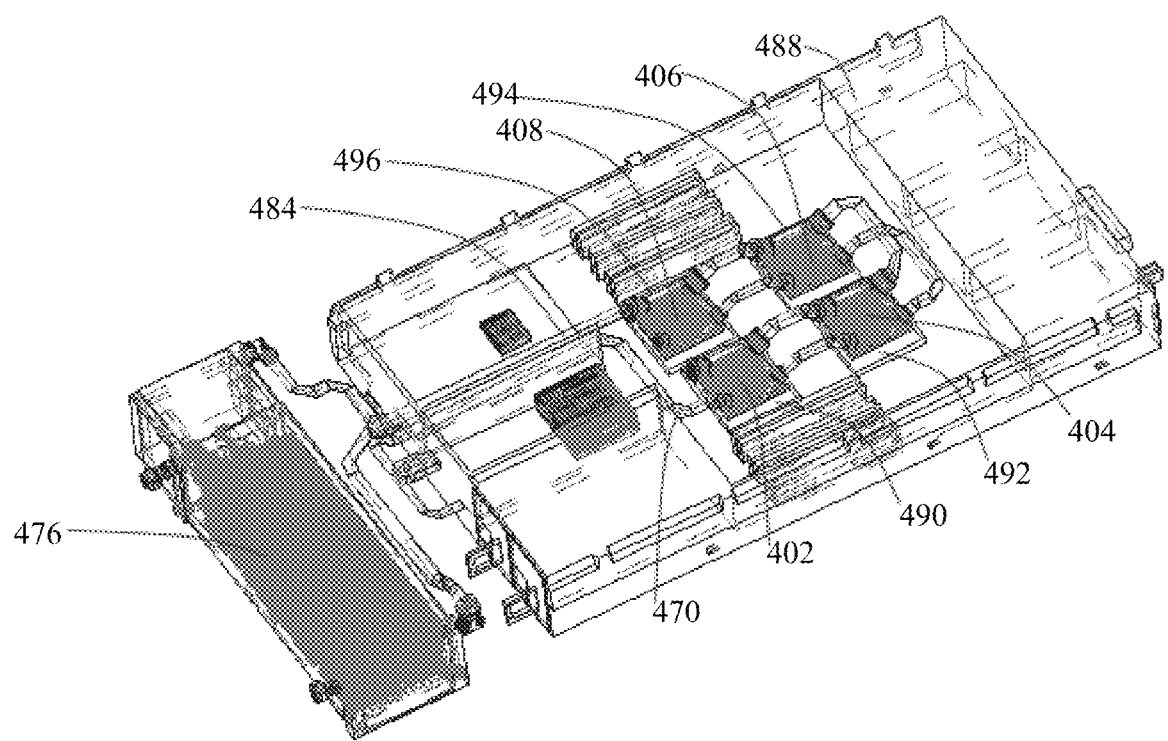

FIGS. 4A-4C illustrate an exemplary reverse-return parallel loop system for four processing units, wherein FIG. 4A shows a block diagram of a reverse-return parallel loop system, FIG. 4B shows a front view of a reverse-return parallel loop system, and FIG. 4C shows a perspective view of a reverse-return parallel loop system, in accordance with an embodiment of the present invention. Each of heat sinks 402-408 may include liquid inlet ports 428, 436, 444, 452, liquid outlet ports 432, 440, 448, 456, vapor inlet ports 426, 434, 442, 450, and vapor outlet ports 430, 438, 446, 454. Supply liquid from first liquid inlet port 428 may be divided into two streams. A first stream may flow to first liquid outlet port 432, while a second stream may flow through first microchannel heat-exchanging core 410. The second stream may be vaporized, and the resulting vapor may flow to first vapor outlet port 430 along with vapor from first vapor inlet port 426. As first heat sink 402 may be installed on the first CPU along the flow direction of the coolant, first vapor inlet port 426 may be blinded. Similarly, as fourth heat sink 408 may be installed on the last CPU along the flow direction of the coolant, fourth liquid outlet port 456 may be blinded. A liquid outlet port of an upstream heat sink may be connected to a liquid inlet port of a subsequent, downstream heat sink. Similarly, a vapor outlet port of an upstream heat sink may be connected to a vapor outlet port of a subsequent, downstream heat sink. For example, without limitation, first vapor outlet port 430 of first heat sink 402 may be connected to second vapor inlet port 434 of second heat sink 402 via first vapor connection line 458, and first liquid outlet port 432 may be connected to second liquid inlet port 436 via first liquid connection line 468.

Liquid supplied from second liquid inlet port 436 may be divided into two streams. A first stream may flow to second liquid outlet port 440, while a second stream may flow through second microchannel heat exchanging core 412. The second liquid stream may be partially vaporized, and the resulting vapor may flow to second vapor outlet port 438 along with vapor from second vapor inlet port 434. Second liquid outlet port 440 may be connected to third liquid inlet port 444 of third heat sink 406 via second liquid connection line 466. Similarly, second vapor outlet port 438 may be connected to third vapor inlet port 442 of third heat sink 406 via second vapor connection line 460.

Liquid supplied from third liquid inlet port 444 may be divided into two streams. A first stream may flow to third liquid outlet port 448, while a second stream may flow through third microchannel heat exchanging core 414. The second liquid stream may be partially vaporized, and the resulting vapor may flow to third vapor outlet port 446 along with vapor from third vapor inlet port 442. Third liquid outlet port 448 may be connected to fourth liquid inlet port 452 of fourth heat sink 408 via third liquid connection line 464. Similarly, third vapor outlet port 446 may be connected to fourth vapor inlet port 450 of fourth heat sink 408 via third vapor connection line 462.

Liquid supplied from fourth liquid inlet port 452 may be divided into two streams. A first stream may flow to fourth liquid outlet port 456, while a second stream may flow through fourth microchannel heat exchanging core 416. The second liquid stream may be partially vaporized, and the resulting vapor may flow to fourth vapor outlet port 454 along with vapor from third vapor inlet port 450. As fourth heat sink 408 may be installed on the last CPU along the flow direction of the coolant, liquid outlet port 456 may be blinded. Fourth vapor outlet port 454 of fourth heat sink 408 may be connected to vapor return hose 470.

As a result, the length and size of the flow path through each of the CPUs may be equal, causing the CPUs to be hydraulically balanced. Flow regulation valves 418-424 may be driven by a thermal actuator installed on each of heat sinks 402-408 for flow control. Additionally, liquid supply hose 484 and vapor return hose 470 may pass through server chassis 488 to be connected with microchannel heat exchanger 476. Microchannel heat exchanger may include vapor manifold 482, heat exchanging core 476, liquid reservoir 474, and one or more liquid pumps 472. Return vapor from fourth heat sink 408 may be supplied through vapor return hose 470 and distributed into the channels of heat exchanging core 476 via vapor manifold 482. Vapor may be condensed into liquid using cold liquid supplied through coolant inlet 478 and returned through coolant outlet 480. Vapor that is condensed into liquid may flow into liquid reservoir 474. Subsequently, one or more liquid pumps 472 in the liquid pump station may transfer liquid from liquid reservoir 474 into liquid supply hose 484.

In the present embodiment, four CPUs are being cooled by reverse-return parallel loop system 400. However, as will be appreciated by one skilled in the art, a lesser or greater number of CPUs may be cooled by reverse-return parallel lip system, depending on a specific server configuration.

Flow regulation valves 418-424 may be driven by a thermal actuators integrated on microchannel heat sinks 402-408 for flow control and control of CPU temperatures. Flow regulation valves 418-424 may be, for example, without limitation, mechanical valves including a thermal actuator and regulation valve mechanism. The thermal actuator may be, for example, without limitation, a wax thermal actuator, a bulb thermal actuator, a diaphragm thermal actuator, a bimetal thermal actuator, a hybrid version of the aforementioned thermal actuators, etc. The regulation valve mechanism may be driven by the thermal actuator to maintain a constant CPU temperature. Because the flow paths through microchannel heat sinks 402-408 are effectively the same length, the required effective pressure drop on flow regulation valves 418-424 may be small, which may result in low energy loss. Similarly, the head pressure of liquid pump 336 may also be low.

Microchannel heat sinks 402-408 may be mounted on CPUs 490-496 respectively. The thermal actuators of flow regulation valves 418-424 may make tight contact with the top surfaces of CPUs 490-496 to ensure quick and accurate responses to temperature variations. Microchannel heat exchanging cores 410-416 may be located inside microchannel heat sinks 402-408. Microchannel heat exchanging cores 410-416 may be composed of multilayered, radial microchannels. The inlet quality of fluid may be controlled at the fluid's subcooled status, which may ensure a best heat transferring coefficient at the lowest wall temperature with minimal pressure drop. The wall temperature is the surface temperature of the heat source (i.e. the CPU).

Liquid supply hose 484 and vapor return hose 470 may run through server chassis 488 to be connected with microchannel heat exchanger 476. Liquid supply hose 484 and vapor return hose 470 may be composed of rigid materials, such as, without limitation, copper, plastic, etc. or flexible materials, such as, without limitation, rubber, plastic, fiberglass, etc. For example, if a high pressure refrigerant was used, the flexible hose could be a polyamide tube, polyester braid, PU sheath. If the working fluid was water, the tube could be PVC. Hard tunes, like copper, may also be used, though it involved higher installation costs and maintainability concerns. The type of tube used may depend on various factors, such as, without limitation, pressure rating of the refrigerant, cost of available materials, etc. Thus, minimal changes to a server chassis are required to incorporate reverse-return parallel loop system 400. Further, large supply and return manifolds may not be required in the present embodiment.

In the present embodiment, single-phase fluids or two-phase fluids may be used in reverse-return parallel loop system 400. Single-phase fluids may include, for example, without limitation, water, glycol solutions, dielectric fluids, etc. Single-phase fluids may provide better flow stability as the length of the flow paths of microchannel heat sinks 402-408 are substantially the same and the fluid status within the flow paths may remain the same. As such, microchannel heat sinks 402-408 may operate in hydraulic equilibrium. Flow regulation valves 418-424 may not need to compensate for hydraulic imbalance between each of the heat sinks, which may simplify the valve design and provide for higher control sensitivity. Two-phase fluids may include, for example, without limitation, various types of refrigerants, etc. and result in a different fluid state in connection lines between microchannel heat sinks 402-408, which may lead to hydraulic nonequilibrium between the heat sinks. For example, without limitation, the fluid status in connection lines 458, 462, 466, 484 may be liquid, and the fluid status in connection lines 460, 464, 468, 470 may be a mixture of liquid and vapor. Hydraulic performance of single-phase fluid and two-phase fluid may be different. For the series system with single phase fluid, the last heat sink along the flow direction will work at the worst conditions among all heat sinks in series, because of the thermal accumulation effects from the heat sinks at its upstream (it has worked under the highest inlet temperature, which is the outlet temperature of its adjacent upstream heat sink). Under the limitation of highest heat sources temperature (for example, the highest permitted temperature of CPU), the fluid supply temperature has to be low enough (chillers may have to be used) to let the last heat sink work properly. For the series system with two phase fluid, the last heat sink along the flow direction will work at the worst conditions among all heat sinks in series, because of the thermal accumulation effects from the heat sinks at its upstream (the inlet vapor quality of last heat sink would be very high because the most of liquid has been vaporized in the upstream heat sinks. it means the last heat sink has to work under almost 'dry' conditions). Under the limitation of highest heat sources temperature (for example, the highest permitted temperature of CPU), the subcooling of fluid supply has to be low enough (chillers may have to be used) to let the last heat sink work properly (get more liquid rather than vapor). For the conventional parallel system with single/two phase fluid, the liquid manifold and vapor return manifold must be larger enough to achieve the hydraulic equilibrium. Especially, for the conventional parallel system with two phase fluid, the heat sink under the highest heat load will be supplied lowest flow volume of liquid because of the presence of large quantity of bubbling (causing high pressure drop), if without any flow mechanism.

In the present embodiment, inlet fluid may be subcooled, and outlet fluid quality may be low, which may result in low temperature differential between wall and fluid, high heat transferring coefficient, and low pressure drop. Because of a lower temperature differential between the wall and fluid, heat recovery may be realized considerably lifting CPU working temperatures. With low outlet vapor quality, pumps with low head and high flow, such as, without limitation centrifugal pumps, may be utilized.

Figure 5A:
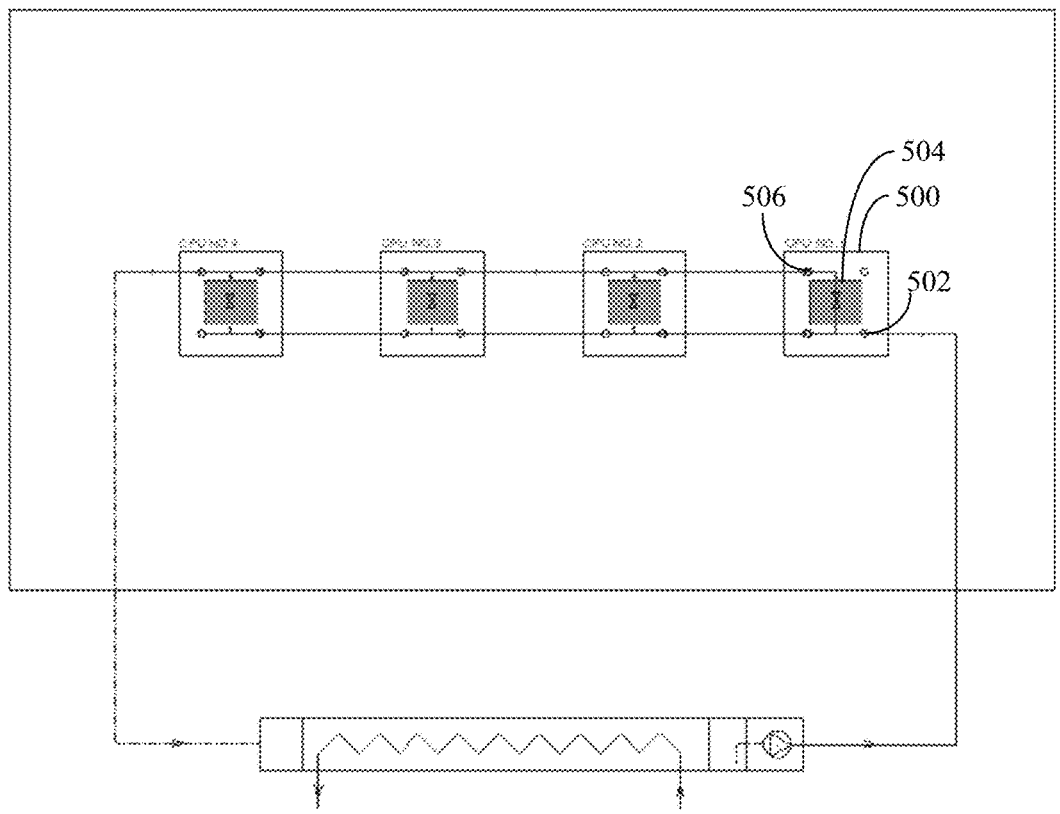
Figure 5B:
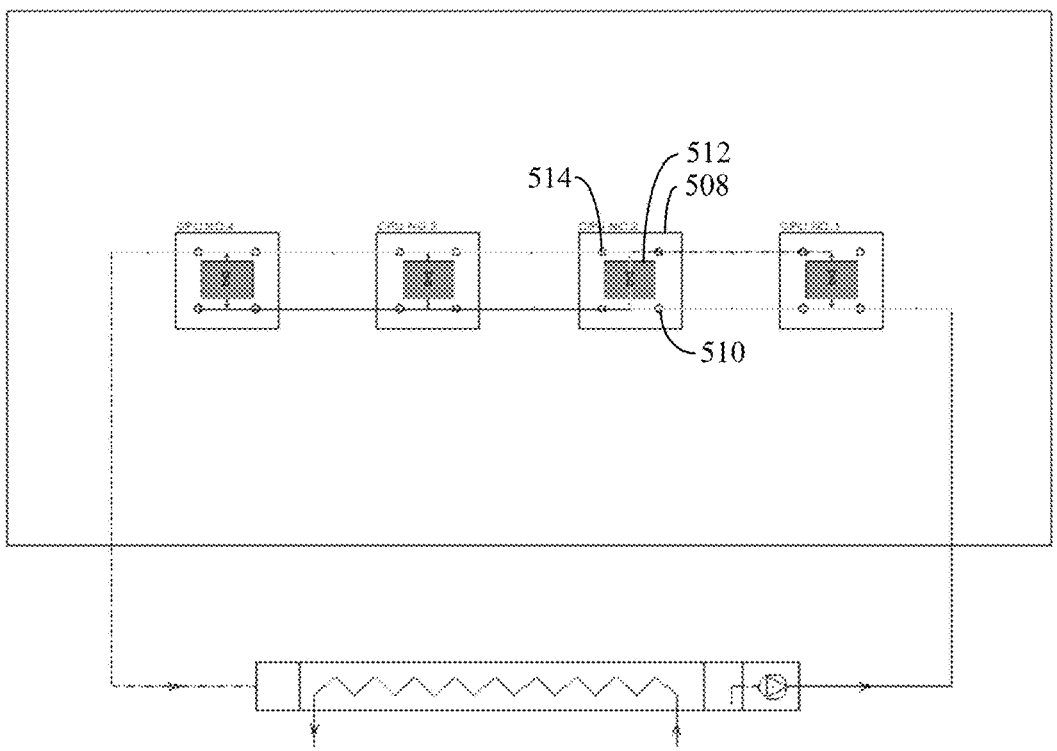

FIGS. 5A-5B illustrate exemplary flow paths within a reverse-return parallel loop system, wherein FIG. 5A shows a flow path for a first CPU and FIG. 5B shows a flow path of a second CPU, in accordance with an embodiment of the present invention. The length and flow paths through each heat sink may be equal, making the heat sinks hydraulically balance.

With reference to FIG. 5A, a flow path for first CPU 504 may have liquid flow through first liquid inlet port 502, through first heat exchanging core 504, and first vapor outlet port 506.

With reference to FIG. 5B, a flow path for second CPU 508 may have liquid flow through second liquid inlet port 510, through second heat exchanging core 512, and out second vapor outlet port 514. As shown, the flow paths for first CPU 504 and second CPU 508 are equal in length. Similarly, the flow path for subsequent CPUs may also be of equal length.

Figure 6:
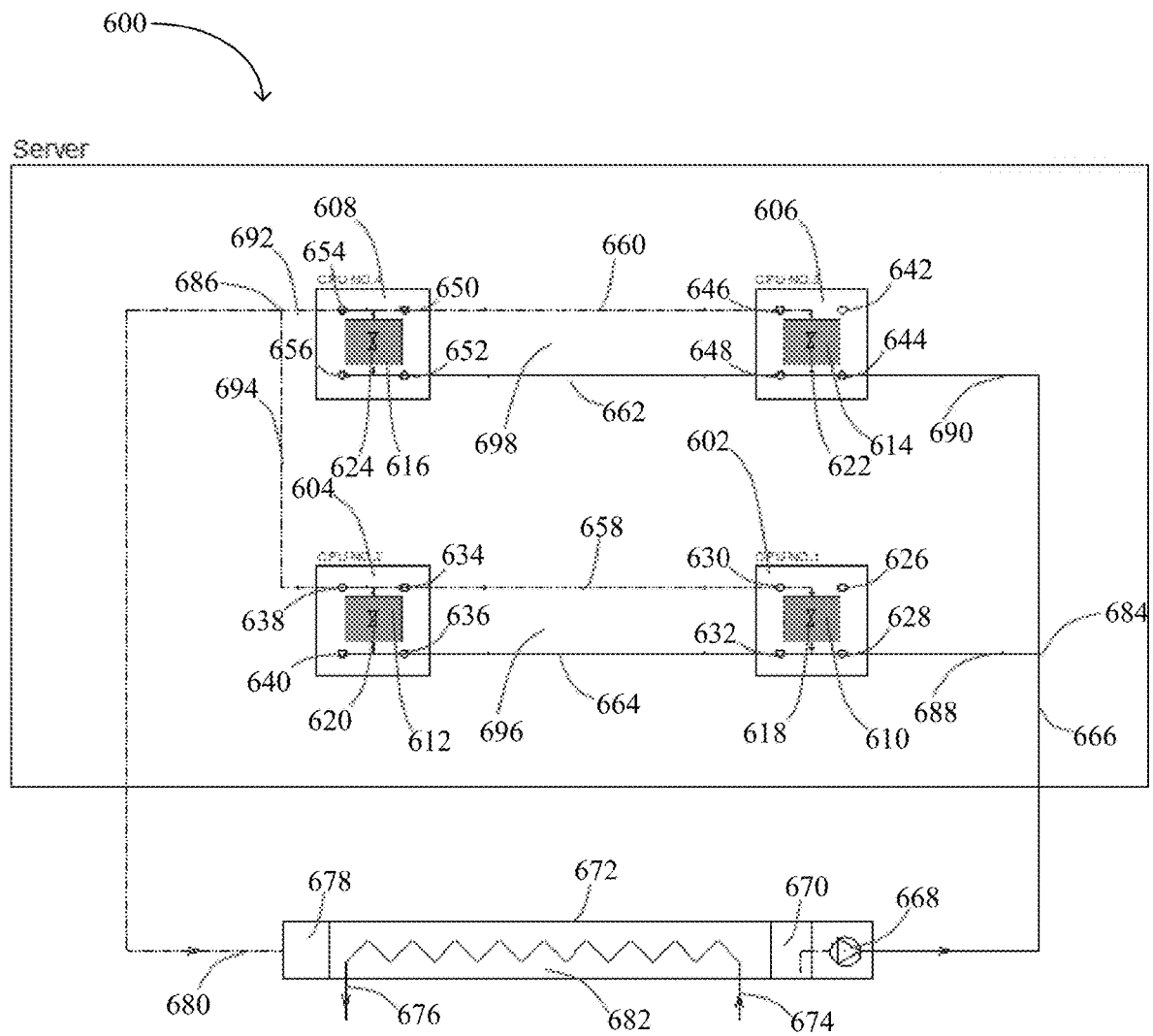
FIG. 6 illustrates an exemplary vertical reverse return system, in accordance with an embodiment of the present invention.

FIG. 6 illustrates an exemplary vertical reverse return system, in accordance with an embodiment of the present invention. Heat sinks 602-608 may be divided into two branches: first branch 696 and second branch 698. First heat sinks 602 and second heat sink 604 may be in first branch 696, while third heat sink 606 and fourth heat sink 608 may be in second branch 698. Liquid supply hose 666 may be divided into first liquid supply line 688 and second liquid supply line 690 at liquid supply line tee 684. Correspondingly, first vapor return line 694 and second vapor return line 692 may be joined at vapor return line tee 686 into vapor return line 680. While four heat sinks are shown in the present embodiment, a greater or lesser number of heat sinks may be used in vertical reverse-return system 600. For example, without limitation, with six heat sinks, three branches with two heat sinks each may be utilized, or two branches with three heat sinks each.

First heat sink 602 of first branch 696 may include first liquid inlet port 628, first vapor inlet port 626, first liquid outlet port 632, and first vapor outlet port 630. Supply liquid from first liquid inlet port 628 may be divided into two streams. A first stream may flow to first liquid outlet port 632, while a second stream may flow through first microchannel heat exchanging core 610. The second stream may be partially vaporized, and the resultant vapor may flow to first vapor outlet port 630. As such, the vapor flowing through first vapor outlet port may include vapor from first microchannel heat exchanging core 610. First heat sink 602 may be installed on the first CPU along the flow direction of the coolant, so first vapor inlet port 626 may be blinded. First liquid outlet port 632 may be connected to second liquid inlet port 636 of second heat sink 604 via first liquid connection line 664. Similarly, first vapor outlet port 630 may be connected to second vapor inlet port 634 of second heat sink 604 via first vapor connection line 658.

Second heat sink 604 of first branch 696 may include second liquid inlet port 636, second vapor inlet port 634, second liquid outlet port 640, and second vapor outlet port 638. Supply liquid from second liquid inlet port 636 may be divided into two streams. A first stream may flow to second liquid outlet port 640, while a second stream may flow through second microchannel heat exchanging core 612. The second stream may be partially vaporized, and the resultant vapor may flow to second vapor outlet port 638. As such, the vapor flowing through second vapor outlet port may include vapor from second microchannel heat exchanging core 612 and second vapor inlet port 634. Second heat sink 604 may be installed on the second CPU along the flow direction of the coolant, so second liquid outlet port 640 may be blinded. Second vapor outlet port 638 may be connected with first vapor return line 694.

Third heat sink 606 of second branch 698 may include third liquid inlet port 644, third vapor inlet port 642, third liquid outlet port 648, and third vapor outlet port 646. Supply liquid from third liquid inlet port 644 may be divided into two streams. A first stream may flow to third liquid outlet port 648, while a second stream may flow through third microchannel heat exchanging core 614. The second stream may be partially vaporized, and the resultant vapor may flow to third vapor outlet port 646. As such, the vapor flowing through third vapor outlet port may include vapor from third microchannel heat exchanging core 614. Third heat sink 606 may be installed on the first CPU of second branch 698 along the flow direction of the coolant, so third vapor inlet port 642 may be blinded. Third liquid outlet port 648 may be connected to fourth liquid inlet port 652 of fourth heat sink 608 via third liquid connection line 662. Similarly, third vapor outlet port 646 may be connected to fourth vapor inlet port 650 of fourth heat sink 608 via third vapor connection line 660.

Fourth heat sink 608 of second branch 698 may include fourth liquid inlet port 652, fourth vapor inlet port 650, fourth liquid outlet port 656, and fourth vapor outlet port 654. Supply liquid from fourth liquid inlet port 652 may be divided into two streams. A first stream may flow to fourth liquid outlet port 656, while a second stream may flow through fourth microchannel heat exchanging core 616. The second stream may be partially vaporized, and the resultant vapor may flow to fourth vapor outlet port 654. As such, the vapor flowing through fourth vapor outlet port may include vapor from fourth microchannel heat exchanging core 616 and fourth vapor inlet port 650. Fourth heat sink 608 may be installed on the second CPU of second branch 698 along the flow direction of the coolant, so fourth liquid outlet port 656 may be blinded. Fourth vapor outlet port 654 may be connected with second vapor return line 692.

Then length and size of the flow path through all heat sinks may be equal, making the flow paths hydraulically balanced.

Flow regulation valves 618-624 may be driven by a thermal actuators integrated on microchannel heat sinks 602-608 for flow control and control of CPU temperatures. Flow regulation valves 618-624 may be, for example, without limitation, mechanical valves including a thermal actuator and regulation valve mechanism. The thermal actuator may be, for example, without limitation, a wax thermal actuator, a bulb thermal actuator, a diaphragm thermal actuator, a bimetal thermal actuator, a hybrid version of the aforementioned thermal actuators, etc. The regulation valve mechanism may be driven by the thermal actuator to maintain a constant CPU temperature. Because the flow paths through microchannel heat sinks 602-608 are effectively the same length, the required effective pressure drop on flow regulation valves 618-624 may be small, which may result in low energy loss. Similarly, the head pressure of liquid pump 668 may also be low.

Microchannel heat sinks 602-608 may be mounted onto first, second, third, and fourth CPUs, respectively. The thermal actuators of flow regulation valves 618-624 may make tight contact with the top surfaces of first, second, third, and fourth CPUs to ensure quick and accurate responses to temperature variations. Microchannel heat exchanging cores 610-616 may be located inside microchannel heat sinks 602-608. Microchannel heat exchanging cores 610-616 may be composed of multilayered, radial microchannels. The inlet quality of fluid may be controlled at the fluid's subcooled status, which may ensure a best heat transferring coefficient at the lowest wall temperature with minimal pressure drop.

Liquid supply hose 666 and vapor return hose 680 may run through a server chassis to be connected with microchannel heat exchanger 672. Liquid supply hose 666 and vapor return hose 680 may be composed of rigid materials, such as, without limitation, copper, plastic, etc. or flexible materials, such as, without limitation, rubber, plastic, fiberglass, etc. For example, if a high pressure refrigerant was used, the flexible hose could be a polyamide tube, polyester braid, PU sheath. If the working fluid was water, the tube could be PVC. Hard tunes, like copper, may also be used, though it involved higher installation costs and maintainability concerns. The type of tube used may depend on various factors, such as, without limitation, pressure rating of the refrigerant, cost of available materials, etc. Thus, minimal changes to a server chassis are required to incorporate vertical reverse-return loop system 600. Further, large supply and return manifolds may not be required in the present embodiment.

Microchannel heat exchanger 672 may include vapor manifold 678, heat exchanging core 682, liquid reservoir 670, and one or more liquid pumps 668. Return vapor may be supplied through vapor return hose 680 and distributed into the channels of heat exchanging core 682 via vapor manifold 678. Vapor may be condensed into liquid using cold liquid supplied through coolant inlet 674 and returned through coolant outlet 676. Vapor that is condensed into liquid may flow into liquid reservoir 670. Subsequently, one or more liquid pumps 668 in the liquid pump station may transfer liquid from liquid reservoir 670 into liquid supply hose 666.

In the present embodiment, single-phase fluids or two-phase fluids may be used in vertical reverse-return loop system 600. Single-phase fluids may include, for example, without limitation, water, glycol solutions, dielectric fluids, etc. Single-phase fluids may provide better flow stability as the length of the flow paths of microchannel heat sinks 602-608 are substantially the same and the fluid status within the flow paths may remain the same. As such, microchannel heat sinks 602-608 may operate in hydraulic equilibrium. Flow regulation valves 618-624 may not need to compensate for hydraulic imbalance between each of the heat sinks, which may simplify the valve design and provide for higher control sensitivity. Two-phase fluids may include, for example, without limitation, various types of refrigerants, etc. and result in a different fluid state in connection lines between microchannel heat sinks 602-608, which may lead to hydraulic nonequilibrium between the heat sinks. For example, without limitation, the fluid status in connection lines 662-664 may be liquid, and the fluid status in connection lines 658-660 may be a mixture of liquid and vapor. Hydraulic performance of single-phase fluid and two-phase fluid may be different. For the series system with single phase fluid, the last heat sink along the flow direction will work at the worst conditions among all heat sinks in series, because of the thermal accumulation effects from the heat sinks at its upstream (it has worked under the highest inlet temperature, which is the outlet temperature of its adjacent upstream heat sink). Under the limitation of highest heat sources temperature (for example, the highest permitted temperature of CPU), the fluid supply temperature has to be low enough (chillers may have to be used) to let the last heat sink work properly. For the series system with two phase fluid, the last heat sink along the flow direction will work at the worst conditions among all heat sinks in series, because of the thermal accumulation effects from the heat sinks at its upstream (the inlet vapor quality of last heat sink would be very high because the most of liquid has been vaporized in the upstream heat sinks. it means the last heat sink has to work under almost 'dry' conditions). Under the limitation of highest heat sources temperature (for example, the highest permitted temperature of CPU), the subcooling of fluid supply has to be low enough (chillers may have to be used) to let the last heat sink work properly (get more liquid rather than vapor). For the conventional parallel system with single/two phase fluid, the liquid manifold and vapor return manifold must be larger enough to achieve the hydraulic equilibrium. Especially, for the conventional parallel system with two phase fluid, the heat sink under the highest heat load will be supplied lowest flow volume of liquid because of the presence of large quantity of bubbling (causing high pressure drop), if without any flow mechanism.

In the present embodiment, inlet fluid may be subcooled, and outlet fluid quality may be low, which may result in low temperature differential between wall and fluid, high heat transferring coefficient, and low pressure drop. Because of a lower temperature differential between the wall and fluid, heat recovery may be realized considerably lifting CPU working temperatures. With low outlet vapor quality, pumps with low head and high flow, such as, without limitation centrifugal pumps, may be utilized.

Figure 7:
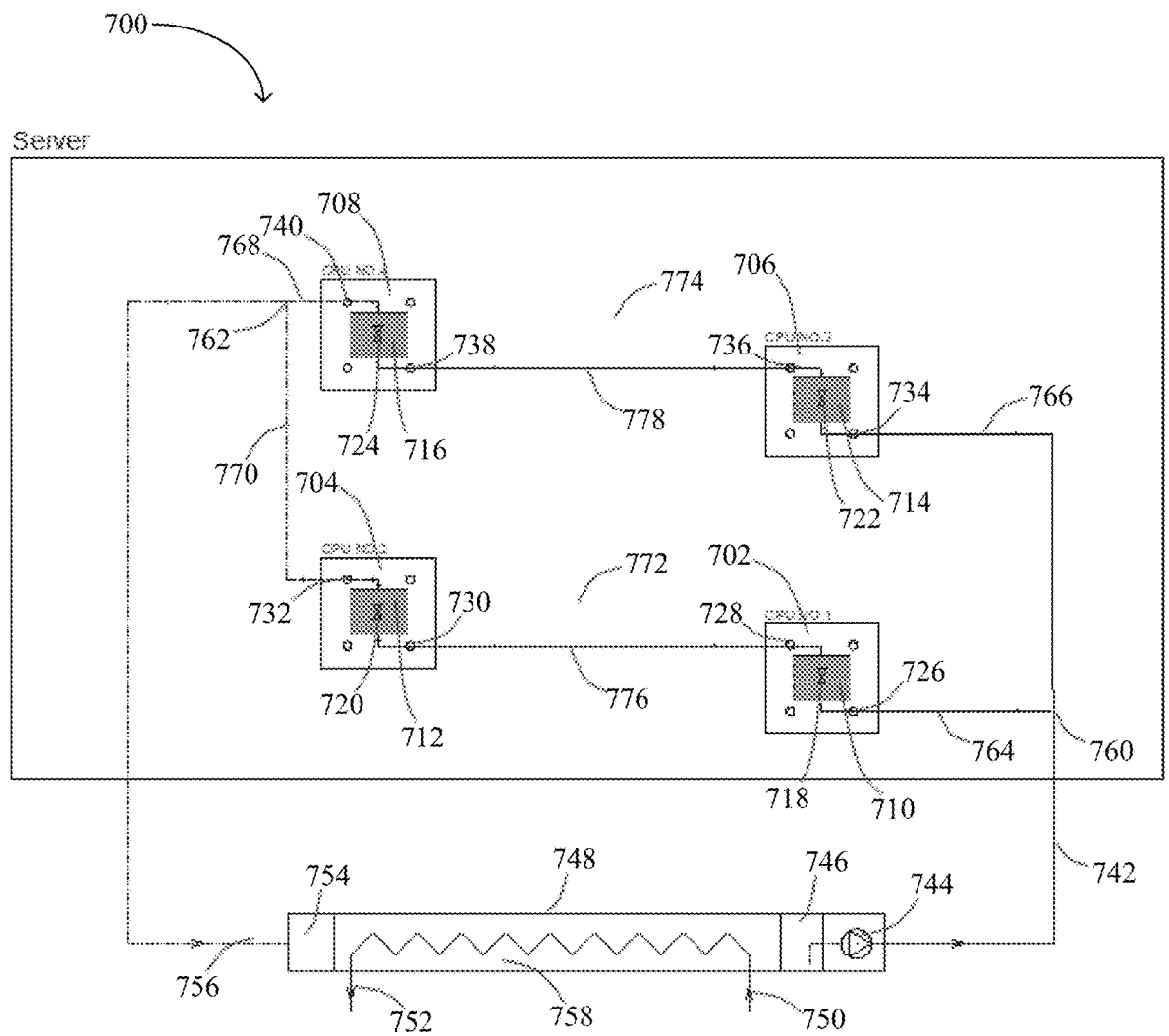
FIG. 7 illustrates an exemplary hybrid reverse return system, in accordance with an embodiment of the present invention.

FIG. 7 illustrates an exemplary hybrid reverse return system, in accordance with an embodiment of the present invention. Hybrid reverse return system 700 may incorporate elements of both parallel reverse return loop system and serial loop system. While the flow path between each heat sink may not be the same length, the length of the flow path for each branch may be the same. Thus, hybrid reverse return system 700 may be suitable for servers incorporating multiple low heat load sources, as the effect of temperature accumulation from upstream heat sinks may be largely ignored with small heat loads. Hybrid reverse return system 700 may be more flexible based on the capacity of heat sources, while simplifying connection lines.

Heat sinks 702-708 may be divided into two branches: first branch 772 and second branch 774. First heat sink 702 and second heat sink 704 may be in first branch 772, while third heat sink 706 and fourth heat sink 708 may be in second branch 774. Liquid supply hose 742 may be divided into first liquid supply line 764 and second liquid supply line 766 at liquid supply line tee 760. Correspondingly, first vapor return line 770 and second vapor return line 768 may be joined at vapor return line tee 762 into vapor return line 756. While four heat sinks are shown in the present embodiment, a greater or lesser number of heat sinks may be used in hybrid reverse-return system 700. For example, without limitation, with six heat sinks, three branches with two heat sinks each may be utilized, or two branches with three heat sinks each.

First heat sink 702 of first branch 772 may include first liquid inlet port 726 and first vapor outlet port 728. Supply liquid from first liquid inlet port 726 may stream through first microchannel heat exchanging core 710. The liquid stream may be partially vaporized, and the resultant vapor may flow to first vapor outlet port 728. First vapor outlet port 728 may be connected to second liquid inlet port 730 of second heat sink 704 via first connection line 776.

Second heat sink 704 of first branch 772 may include second liquid inlet port 730 and second vapor outlet port 732. Supply liquid from second liquid inlet port 730 may stream through second microchannel heat exchanging core 712. The liquid stream may be partially vaporized, and the resultant vapor may flow to second vapor outlet port 732. Second vapor outlet port 732 may be connected to first vapor return line 770.

Third heat sink 706 of second branch 774 may include third liquid inlet port 734 and third vapor outlet port 736. Supply liquid from third liquid inlet port 734 may stream through third microchannel heat exchanging core 714. The liquid stream may be partially vaporized, and the resultant vapor may flow to third vapor outlet port 736. Third vapor outlet port 736 may be connected to fourth liquid inlet port 738 of fourth heat sink 708 via second connection line 778.

Fourth heat sink 708 of second branch 774 may include fourth liquid inlet port 738 and fourth vapor outlet port 740. Supply liquid from fourth liquid inlet port 738 may stream through fourth microchannel heat exchanging core 716. The liquid stream may be partially vaporized, and the resultant vapor may flow to fourth vapor outlet port 740. Fourth vapor outlet port 740 may be connected to second vapor return line 768.

Then length and size of the flow path through all heat sinks may be equal, making the flow paths hydraulically balanced.

Flow regulation valves 718-724 may be driven by a thermal actuators integrated on microchannel heat sinks 702-708 for flow control and control of CPU temperatures. Flow regulation valves 718-724 may be, for example, without limitation, mechanical valves including a thermal actuator and regulation valve mechanism. The thermal actuator may be, for example, without limitation, a wax thermal actuator, a bulb thermal actuator, a diaphragm thermal actuator, a bimetal thermal actuator, a hybrid version of the aforementioned thermal actuators, etc. The regulation valve mechanism may be driven by the thermal actuator to maintain a constant CPU temperature. Because the flow paths through microchannel heat sinks 702-708 are effectively the same length, the required effective pressure drop on flow regulation valves 718-724 may be small, which may result in low energy loss. Similarly, the head pressure of liquid pump 744 may also be low.

Microchannel heat sinks 702-708 may be mounted onto first, second, third, and fourth CPUs, respectively. The thermal actuators of flow regulation valves 718-724 may make tight contact with the top surfaces of first, second, third, and fourth CPUs to ensure quick and accurate responses to temperature variations. Microchannel heat exchanging cores 710-716 may be located inside microchannel heat sinks 702-708. Microchannel heat exchanging cores 710-716 may be composed of multilayered, radial microchannels. The inlet quality of fluid may be controlled at the fluid's subcooled status, which may ensure a best heat transferring coefficient at the lowest wall temperature with minimal pressure drop.

Liquid supply hose 742 and vapor return hose 756 may run through a server chassis to be connected with microchannel heat exchanger 748. Liquid supply hose 742 and vapor return hose 756 may be composed of rigid materials, such as, without limitation, copper, plastic, etc. or flexible materials, such as, without limitation, rubber, plastic, fiberglass, etc. For example, if a high pressure refrigerant was used, the flexible hose could be a polyamide tube, polyester braid, PU sheath. If the working fluid was water, the tube could be PVC. Hard tunes, like copper, may also be used, though it involved higher installation costs and maintainability concerns. The type of tube used may depend on various factors, such as, without limitation, pressure rating of the refrigerant, cost of available materials, etc. Thus, minimal changes to a server chassis are required to incorporate hybrid reverse-return system 700. Further, large supply and return manifolds may not be required in the present embodiment.

Microchannel heat exchanger 748 may include vapor manifold 754, heat exchanging core 758, liquid reservoir 746, and one or more liquid pumps 744. Return vapor may be supplied through vapor return hose 756 and distributed into the channels of heat exchanging core 748 via vapor manifold 754. Vapor may be condensed into liquid using cold liquid supplied through coolant inlet 750 and returned through coolant outlet 752. Vapor that is condensed into liquid may flow into liquid reservoir 746. Subsequently, one or more liquid pumps 744 in the liquid pump station may transfer liquid from liquid reservoir 746 into liquid supply hose 742.

In the present embodiment, single-phase fluids or two-phase fluids may be used in hybrid reverse return loop 700. Single-phase fluids may include, for example, without limitation, water, glycol solutions, dielectric fluids, etc. Two-phase fluids may include, for example, without limitation, various types of refrigerants, etc.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing a reverse-return parallel loop system according to the present invention will be apparent to those skilled in the art. Various aspects of the invention have been described above by way of illustration, and the specific embodiments disclosed are not intended to limit the invention to the particular forms disclosed. The particular implementation of the reverse-return parallel loop system may vary depending upon the particular context or application. By way of example, and not limitation, the reverse-return parallel loop system described in the foregoing were principally directed to server cooling implementations; however, similar techniques may instead be applied to consumer electronics cooling, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A reverse-return parallel loop thermal management system for an electronic device, comprising:
    a plurality of heat sinks with a series of thermal pathways configured to provide hydraulically balanced liquid coolant to each heat sink in said plurality of heat sinks, wherein each heat sink diverts at least a portion of said liquid coolant across a heat sink exchanging core, thereby at least partially vaporizing said liquid coolant, and wherein each heat sink diverting a remaining portion of the liquid coolant to a downstream heat sink;
    each heat sink in said plurality of heat sinks is configured to be in thermal communication with a heat source;
    each heat sink in said plurality of heat sinks having a liquid-in port, a liquid-out port, a vapor-inlet port, and a vapor-outlet port;
    each heat sink in said plurality of heat sinks is configured to have at least one thermal pathway, wherein said at least one thermal pathway begins at said liquid-in port and flows to a divide, thereby splitting said at least one thermal pathway in two separate thermal pathways, wherein a first path flows to said liquid-out port and a second path passes through said heat sink exchanging core,
    flows out through said vapor-outlet port;
    liquid coolant entering each heat sink and following a first thermal pathway flows through the first liquid outlet port as a liquid; and
    liquid coolant entering each heat sink and following a second thermal pathway flows through said heat sink exchanging core, wherein said liquid is at least partially vaporized before exiting said heat sink through said vapor-outlet port.

2. The reverse-return parallel loop thermal management system for an electronic device, as recited in claim 1, further comprising:
    said vapor-outlet port on a first heat sink connecting, by way of a conduit, to a vapor-inlet port on a downstream heat sink;
    said liquid-in port on said first heat sink receiving liquid coolant from a liquid coolant supply;
    said liquid-out port on said first heat sink connecting, by way of a conduit, to a liquid-in port on a downstream heat sink;
    said vapor-outlet port on a last heat sink connecting, by way of a conduit, to a liquid coolant return, thereby returning said at least partially vaporized liquid coolant;
    said liquid-in port on said last heat sink receiving liquid coolant from an upstream heat sink; and
    said vapor-inlet port on said last heat sink receiving said at least partially vaporized liquid coolant from an upstream heat sink.

3. The reverse-return parallel loop thermal management system for an electronic device, as recited in claim 2, further comprising:
    said vapor-inlet port on said first heat sink in said plurality of heat sinks is blinded; and
    said liquid-out port on said last heat sink in said plurality of heat sinks is blinded.

4. The reverse-return parallel loop thermal management system for an electronic device, as recited in claim 2, wherein said conduit is comprised of a rigid material, wherein said rigid material is at least one of copper or plastic.

5. The reverse-return parallel loop thermal management system for an electronic device, as recited in claim 2, wherein said conduit is comprised of a flexible material, wherein said flexible material is at least one of rubber, plastic, or fiberglass.

6. The reverse-return parallel loop thermal management system for an electronic device, as recited in claim 1, wherein each heat sink in said plurality of heat sinks further includes a flow regulation valve, wherein said flow regulation valve is engaged by one or more actuators to control a flow of liquid coolant to thereby influence CPU temperature by adjusting thermal transmission from the CPU to the liquid coolant.

7. The reverse-return parallel loop thermal management system for an electronic device, as recited in claim 6, wherein the one or more actuator is a thermal actuator capable of sensing temperature variation and thereby regulate the flow of liquid coolant by increasing or decreasing an opening of the flow regulation valve.

8. The reverse-return parallel loop thermal management system for an electronic device, as recited in claim 7, wherein the thermal actuator is at least one of a wax thermal actuator, a bulb actuator, a diaphragm actuator, a bimetal actuator, or a servomotor with temperature sensor.

9. The reverse-return parallel loop thermal management system for an electronic device, as recited in claim 6, wherein the one or more actuator is an electric actuator.

10. The reverse-return parallel loop thermal management system for an electronic device, as recited in claim 1, wherein said heat sink exchanging core further comprises bunches of multilayered, radial microchannels.

11. A system, comprising:
a cooling cycle for an electronic device, wherein said cooling cycle includes a plurality of heat sinks, at least one system heat exchanger, and at least one liquid pump;
liquid coolant, wherein said liquid coolant cycles through said at least one heat exchanger and collects in a liquid reservoir;
said at least one liquid pump routes said liquid coolant from said liquid reservoir, through a conduit, to a liquid-in port on a first heat sink in said plurality of heat sinks;
said plurality of heat sinks cycles the liquid coolant over at least one CPU, wherein a thermal transfer of heat removes heat from said at least one CPU;
a final heat sink routes the liquid coolant out through a vapor-outlet port in to a conduit, which connects said vapor-outlet port of said final heat sink to a vapor manifold of said system heat exchanger;
said system heat exchanger is cooled by an external coolant in thermal communication with said liquid coolant, and enters said system heat exchanger through a coolant inlet, and exits said system heat exchanger through a coolant outlet;
wherein said plurality of heat sinks further includes a series of thermal pathways configured to provide hydraulically balanced liquid coolant to each heat sink in said plurality of heat sinks, wherein each heat sink diverts at least a portion of said liquid coolant across a heat exchanging core, thereby at least partially vaporizing said liquid coolant, and diverting a remaining portion of the liquid coolant to a downstream heat sink;
each heat sink in said plurality of heat sinks is configured to be in thermal communication with said at least one CPU;
each heat sink in said plurality of heat sinks having a liquid-in port, a liquid-out port, a vapor-inlet port, and a vapor-outlet port;
each heat sink in said plurality of heat sinks is configured to have at least one thermal pathway, wherein said at least one thermal pathway begins at said liquid-in port and flows to a divide, thereby splitting said at least one thermal pathway in two separate thermal pathways, wherein a first path flows to a liquid-out port and a second path passes through said heat exchanging core, and flows out through a vapor-outlet port; and
wherein each heat sink in said plurality of heat sinks having individual or discrete heat exchanging core.

12. The system, as recited in claim 11, wherein the liquid coolant is a single-phase fluid.

13. The system, as recited in claim 12, wherein the single-phase fluid is at least one of water, a glycol solution, or a dielectric fluid.

14. The system, as recited in claim 11, wherein the liquid coolant is a two-phase fluid.

15. The system, as recited in claim 14, wherein the two-phase fluid is a refrigerant.

16. The system as recited in claim 11, wherein:
liquid coolant entering each heat sink and following a first thermal pathway flows through the liquid-out port as a liquid; and
liquid coolant entering each heat sink and following a second thermal pathway flows through said heat exchanging core, wherein said liquid is at least partially vaporized before exiting said heat sink through said vapor-outlet port.

17. The system as recited in claim 16, further comprising:
said vapor-outlet port on said first heat sink connecting, by way of a conduit, to a vapor-inlet port on a downstream heat sink;
said liquid-in port on said first heat sink receiving liquid coolant from a liquid coolant supply, wherein said liquid coolant supply is said liquid pump in said system heat exchanger;
said liquid-out port on said first heat sink connecting, by way of a conduit, to a liquid-in port on a downstream heat sink;
said vapor-outlet port on said last heat sink connecting, by way of a conduit, to a liquid coolant return, thereby returning said at least partially vaporized liquid coolant to said vapor manifold of said system heat exchanger;
said liquid-in port on said last heat sink receiving liquid coolant from an upstream heat sink; and
said vapor-inlet port on said last heat sink receiving said at least partially vaporized liquid coolant from an upstream heat sink.

18. The system as recited in claim 17, wherein each heat sink in said plurality of heat sinks further includes a flow regulation valve, wherein said flow regulation valve is engaged by one or more actuators to control a flow of liquid coolant to thereby influence heat sources temperature by adjusting thermal transmission from the heat sources to the liquid coolant.

19. The system as recited in claim 18, wherein said heat exchanging core further comprises bunches of multilayered, radial microchannels.

20. A reverse-return parallel loop system, comprising:
a cooling cycle for an electronic device, wherein said cooling cycle includes at least two heat sinks, at least one system heat exchanger, and at least one liquid pump;
liquid coolant, wherein said liquid coolant cycles through said at least one heat exchanger and collects in a liquid reservoir;
said at least one liquid pump routes said liquid coolant from said liquid reservoir, through a conduit, to a liquid-in port on a first heat sink of said two heat sinks;
said two heat sinks are configured to cycle the liquid coolant over two heat sources, wherein a thermal transfer of heat removes heat from said two heat sources;
each heat sink has a liquid-inlet port, a liquid-outlet port, a vapor-inlet port, and a vapor-outlet port;
said vapor-inlet port on said first heat sink in said at least two heat sinks is blinded;
said liquid-out port on said second heat sink in said at least two heat sinks is blinded;
a conduit connects the at least one liquid pump to a liquid-inlet port on a first heat sink, wherein the liquid coolant is split in to two thermal streams with a first stream heading through a liquid-outlet port on the first heat sink, and a second stream heading toward a heat exchange core of the first heat sink;
said second stream becoming at least partially vaporized in said heat exchange core of said first heat sink, whereby said at least partially vaporized liquid coolant flows out of said vapor-outlet of said first heat sink toward a vapor inlet of a second heat sink by way of a conduit;
said liquid-outlet port of said first heat sink connects via a conduit to a liquid-inlet port on the second heat sink of the system, wherein the liquid coolant flows through the heat exchanger core of the second heat sink, where it is at least partially vaporized by absorbing heat from a second heat sources, and merges with vapor from the first heat sink as it is carried out the vapor-outlet port and through the return conduit of the system to a vapor manifold of said system heat exchanger;
said system heat exchanger is cooled by an external coolant in thermal communication with said liquid coolant, and enters heat exchanger of the system through a coolant inlet, and exits the heat exchanger of the system through a coolant outlet;
said first sink further includes a flow regulation valve, wherein said flow regulation valve is engaged by one or more actuators to control a flow of liquid coolant to thereby influence heat sources, temperature by adjusting thermal transmission from the heat sources to the liquid coolant;
said second heat sink further includes a flow regulation valve, wherein said flow regulation valve is engaged by one or more actuators to control a flow of liquid coolant to thereby influence heat sources temperature by adjusting thermal transmission from the heat sources to the liquid coolant;
said one or more actuators in said first heat sink and second heat sink are thermal actuators capable of sensing temperature variation and thereby regulate the flow of liquid coolant by increasing or decreasing an opening of the flow regulation valve; and
each heat exchanging core in said first heat sink and said second heat sink further comprise bunches of multilayered, radial microchannels.

* * * * *